United States Patent [19]

Kahn

[11] 4,143,325

[45] Mar. 6, 1979

[54] CONSTANT AMPLITUDE INTERFERENCE SQUELCH SYSTEM

[76] Inventor: Leonard R. Kahn, 137 E. 36 St., New York, N.Y. 10016

[21] Appl. No.: 716,332

[22] Filed: Aug. 20, 1976

[51] Int. Cl.² ............................................. H04B 1/10
[52] U.S. Cl. ..................................... 325/478; 179/1 P
[58] Field of Search ....................... 325/478, 348, 474; 179/1 P; 328/165

[56] References Cited

U.S. PATENT DOCUMENTS

| | | | |
|---|---|---|---|
| 3,102,236 | 8/1963 | Eichenberger et al. | 325/478 |
| 3,350,650 | 10/1967 | Kemper | 325/478 |
| 3,397,401 | 8/1968 | Winterbottom | 325/478 |

Primary Examiner—Robert L. Griffin
Assistant Examiner—Marc E. Bookbinder

[57] ABSTRACT

A squelch circuit for muting constant amplitude interference when the signal is absent. The input wave's envelope characteristic is examined so as to determine if the envelope is constant and, if it is, a gate is controlled so that the input wave is muted. Time delay circuitry is provided in one embodiment in order to provide sufficient time to make a determination that constant amplitude interference is present rather than variable amplitude speech before muting the input wave.

5 Claims, 1 Drawing Figure

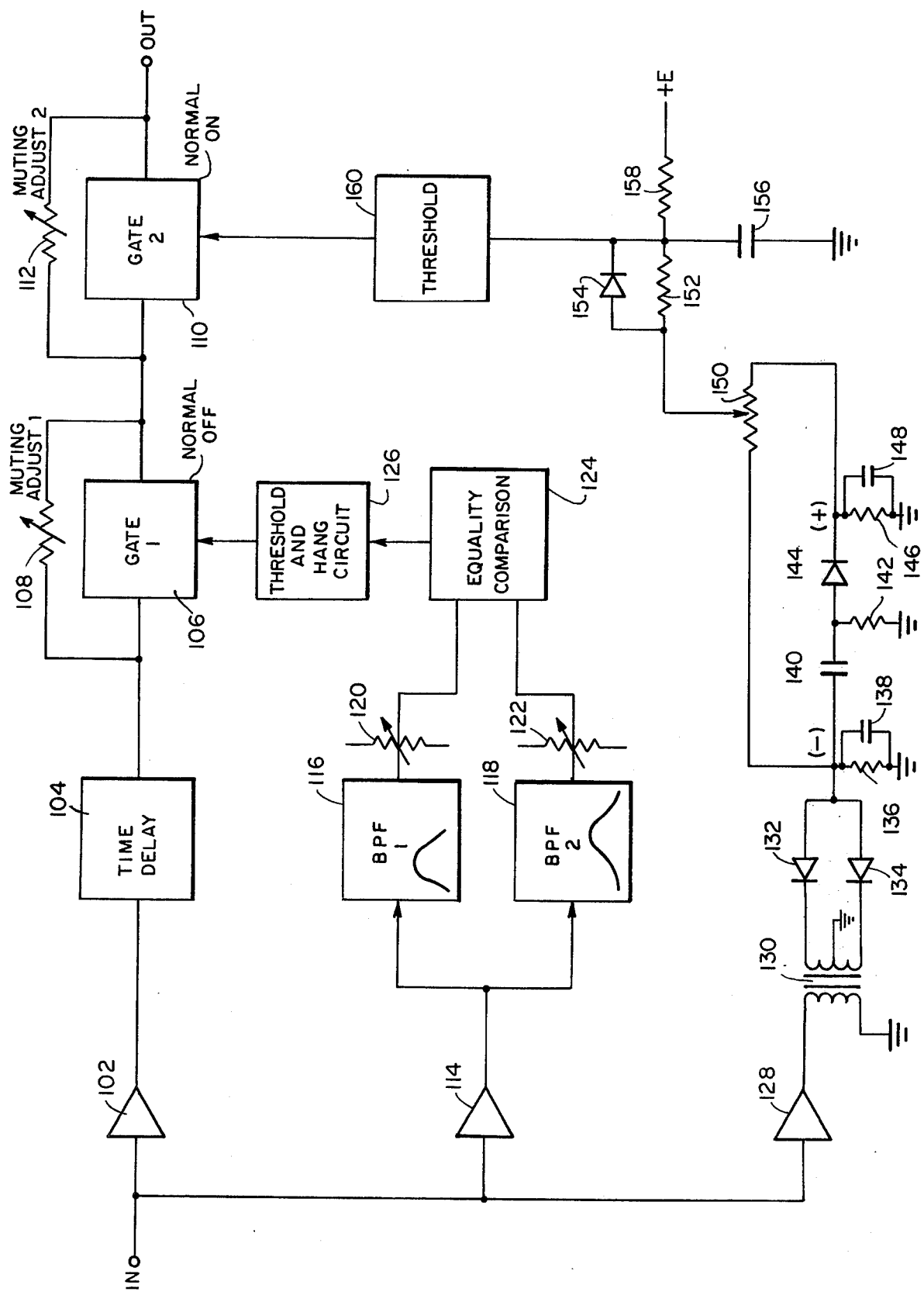

CONSTANT AMPLITUDE INTERFERENCE SQUELCH SYSTEM

CROSS REFERENCE TO RELATED APPLICATIONS

My "Signal Presence Determination Method", Ser. No. 693,716, filed June 7, 1976 and "Squelch and Message Storage System and Method", Ser. No. 708,203, filed July 23, 1976 applications are related, in general, to squelch systems.

BACKGROUND OF THE INVENTION

There are a number of methods for sensing the presence of speech. Most of these methods are based upon the measurement of strength of the incoming wave. However, strong interference can confuse such systems and falsely indicate that signal is present.

A number of alternative methods for sensing the presence of signals are described in patent application, Ser. No. 693,716. One of the systems disclosed is based upon the determination that the input wave resembles an expected noise or interference waveshape, and if it does resemble the waveshape the information is used to operate a circuit which squelches or attenuates the output wave. FIG. 3 of patent application Ser. No. 693,716 shows one circuit for accomplishing the waveshape comparison operation.

Other arrangements have been disclosed for improving squelch performance such as reissued patent, Re. 27,202 where the communications channel is split into two or more segments and means are provided for comparing the energy in each segment. The gain for each segment is adjusted so that for normal types of noise the energy in each segment is equal. Generally, the adjustment is made for white noise, but the adjustment can also be made for a constant amplitude tone. However, if the tone varies in frequency, the system requires constant readjustment.

SUMMARY OF THE INVENTION

A general object of the instant invention is to provide means for squelching or muting constant amplitude interfering waves. A further object is to produce a squelch or muting system which can provide protection from constant amplitude interference and, at the same time, provide protection from white or impulse noise.

An additional object is to provide a system that provides reliable protection against constant amplitude interference and where the circuitry required to sense the constant amplitude wave is relatively inexpensive.

These and other objects of this invention will become apparent to those skilled in the art upon consideration of the accompanying specification, drawing and claims.

As mentioned in the patent application Ser. No. 693,716 there are three basic forms of squelch in wide use today:

(1) The total amplitude measurement method.

(2) The sensing of some special characteristic of the signal which distinguishes it from noise and the indication that signal is present when such conditions occur.

(3) The comparison of the input wave with the characteristic of noise or interference and the indication that signal is present whenever the incoming wave does not match the noise or interference characteristic.

The invention, as disclosed in patent application Ser. No. 693,716 is based upon the last type of signal detection. The present invention is also based upon this last type of arrangement and, more specifically, is based upon the waveshape characteristic of the interference.

A method is described herein for accurately and reliably testing whether the input wave is a constant amplitude wave. Use is made of an envelope detector which is ac coupled to a second detector circuit. If only the first detector produces a voltage output, it is concluded that a constant amplitude interfering wave is present. This system can be used at audio frequencies and IF frequencies, but if it is used at IF, this system is limited to those types of modulation that incorporate an envelope modulation component such as amplitude modulation and single-sideband modulation. It is not applicable to IF detection of constant amplitude signals such as FM or phase modulation signals and, in fact, a system utilizing the constant amplitude of FM has been used to detect the presence of signal; i.e., if the input wave had a constant amplitude it was determined that signal was present. Such systems had been used in squelch systems in FM receivers and are to be distinguished from the present invention. In the present case, the detection of a constant amplitude wave indicates the presence of interference not signal.

In the present invention, it is highly desirable to use opposite polarity detectors in the constant envelope determination circuitry. The reason for this is that when the first detector detects the leading edge of a pulse of interference, a transient voltage component passes through the coupling circuit to the second detector but it is blocked because of the polarity of the second detector thus avoiding a false indication of signal presence.

If the constant envelope determining system is used at audio frequencies it is difficult to provide proper filtering of the audio tone frequency, especially for low frequency interfering tones. However, if a full wave rectifier or other form of polyphase detection is used, the ripple frequency is increased and the amplitude of the ripple is decreased reducing the requirements for ripple filtering. By reducing the requirements for the filtering, the time delay of operation of the circuit can be minimized.

In the preferred embodiment of the invention, a fixed time delay circuit is incorporated having a time delay of approximately 100 to 200 milliseconds. The use of a time delay circuit is advantageous as it allows sufficient time for a determination that a constant amplitude interfering wave is present, rather than voice. Since voice waves have slow syllabic envelope modulation components it is difficult to determine that the envelope is actually varying in a very short period. However, if 100 or 200 milliseconds are available for the examination a reliable determination may be made.

BRIEF DESCRIPTION OF THE DRAWING

The foregoing and other objective features and characteristics of the present invention will be apparent from the following specification, description, and accompanying drawing relating to typical embodiments thereof.

FIG. 1 is the sole drawing and shows, in block and schematic form, the preferred embodiment of the invention.

DESCRIPTION OF THE PREFERRED EMBODIMENT

FIG. 1, the sole FIGURE, shows one embodiment of the instant invention. The input wave is amplified in amplifier 102 which in turn feeds a time delay circuit 104. The delay time provided may be in the order of 150 ms. Time delay circuit 104 may be a endless loop magnetic delay circuit such as used in U.S. Pat. No. 2,880,275 and patent application Ser. No. 708,203, or an electronic delay circuit using, for example, charge coupled devices. In this specification and the attached claims, time delay circuit is meant to include all forms of time delay devices, including mechanical, electrical, acoustical, etc.

The output of delay unit 104 feeds Gate 1, 106 which is normally off or open. Thus, if signal is absent, noise will not pass through Gate 1. Amplifier 114 samples the signal ahead of the time delay circuit 104 and feeds BPF1, 116 and BPF2, 118 which compare spectrum energy at two different spectrum points, and the levels are compared in equality comparison circuit 124 after being suitably weighted by attenuators 120 and 122. The output of block 124 feeds threshold and hang circuit 126 which in turn controls Gate 1, 106. Shunted variable resistor 108 provides a muting control, the smaller the resistance the higher the level of the muted sound.

The portion of the block using blocks 106, 114, 116, 118, 120, 122, 124 and 126 follow the teaching of U.S. Pat. No. Re. 27,202. For more details regarding the operation of the noise squelch portion of FIG. 1, consult Patents Re. 27,202 and patent application Ser. No. 693,716. While such a squelch system has important advantages in muting noise and certain types of interference, it is not essential to utilize the method in order to practice the present invention. Actually, if one is only concerned with constant amplitude tone type interference, it is unnecessary to provide any form of conventional noise squelch circuit.

The output of Gate 1, 106 feeds Gate 2, 110 and its muting control 112. Gate 2, 110 is normally "on", passing signal at full strength, but, when a steady tone of sufficient level present at the input circuit, Gate 2, 110 opens, attenuating the output wave.

The circuit which detects the presence of tones and causes Gate 2, 110 to open, operates as follows: Amplifier 128 amplifies a sample of the undelayed input wave. The amplified wave is detected in the full wave detector circuit which consists of components 130, 132, 134, 136 and 138. This circuit is conventional and produces a negative voltage which is approximately a linear function of the input signal level. The time constant of RC circuit 136 and 138 is such as to produce filtering for at least the lowest audio frequency tone interference expected.

The output of envelope detector 134 is ac coupled through capacitor 140 to the detector circuit using components 142, 144, 146 and 148. This detector produces a positive voltage when an ac component is produced by the envelope detector feeding it. However, if a constant amplitude interfering tone has sufficient level to overcome the signal and noise, and has a frequency above 300 Hz, no voltage is produced by the second detector. This is because a constant tone is free of envelope modulation, and therefore no ac voltage is coupled through capacitor 140.

However, when a voice wave is present, envelope variations are present, and the resulting variations at the output of the envelope detector using diode 134 are coupled through capacitor 140 to the second detector using diode 144. Thus, when speech is present a positive voltage appears across resistor 146.

The positive voltage produced across resistor 146 is fed to one end of potentiometer 150 and the other end of the potentiometer is connected to resistor 136 where a negative voltage appears. The arm of potentiometer 150 is connected to resistor 152 and diode 154. Diode 154 is connected so that whenever the voltage at the arm of 150 is more positive than the voltage across capacitor 156 by at least the contact voltage of diode 154, the diode conducts. This diode circuit speeds up the turn on action of gate 2, thus helping to avoid clipping of initial speech sounds. If a negative voltage is present at the arm of 150, as would be the case when steady tones are present, resistor 152 provides a slower means for charging capacitor 156. When the top lead of capacitor 156 becomes sufficiently negative it causes threshold circuit 160 to open gate 2, muting the signal. Muting adjust 112 can be varied to adjust the amount of muting.

In operation, the voltage produced across resistor 136 is a relatively constant negative voltage when only steady tones are received. The negative voltage will open the gate prior to the instant when the tone reaches the gate because the control circuit operates before time delay circuit 104 passes the signal. Thus, when the circuit is properly designed, the time delay introduced by time delay circuit 104 is larger than the time delay of the detection circuitry. For example, if the time delay network 104 introduces a 150 millisecond time delay, the time constants in the turnoff circuit should introduce an overall time delay of, say, 140 milliseconds, and gate 2 will open before the interfering tone reaches the output of time delay 104.

Similarly, the time constants in the system controlling gate 1, 106 should also approximate the time delay of 104. The larger the time delay used in such a circuit, the more reliable the system and the less prone it will be to false activation by noise; i.e., false alarms. It is preferable to make the operating time of that circuit slightly less than the time delay of 104 so that the initial speech sounds are not clipped, although a slight clipping, say 10 to 20 milliseconds, is acceptable for most services.

Thus, it is seen that the use of time delay 104 can both improve the operating characteristics of the squelch circuit and provide time for the system to protect against annoying tone bursts. U.S. Pat. No. 3,397,401 and application Ser. No. 708,203 discloses the use of time delay circuits to improve conventional squelch performance. In some applications where cost must be severely limited, the time delay unit may be eliminated but, in this case, short tone bursts would be heard and the turn on time of the normal squelch would have to be shortened in order to avoid clipping of sizeable segments of the speech.

It should be noted that a full wave detector using diodes 132 and 134 is connected so as to produce negative voltage whereas diode detector 144 is connected to produce positive voltage. That is, the two rectifiers produce opposite polarity voltages. This is the preferred arrangement because, when a tone is received, the initial transient will only produce a negative voltage, and the 144 diode is connected so that the transient voltage cannot be passed along. Thus, by using the diodes in opposite polarities, the system is appreciably less sensitive to false operation.

Gate 1 and gate 2 may be replaced by a single gate with the appropriate logic control circuitry, and a single muting adjust circuit may replace variable resistors 108 and 112. Also, the operation of gate 2 can be changed to "normal OFF" by changing the bias arrangement; but, while normal off operation will provide better protection against tone bursts, it may cause occasional clipping of speech. All of these alternative forms of operation would be recognized as readily achievable by those skilled in the art.

In all cases, it is understood that the above described arrangements are merely illustrative of the many possible specific embodiments which represent applications of the present invention. Numerous and other varied arrangements can be readily devised in accordance with the principles of the present invention without departing from the spirit and scope of the invention.

What is claimed is:

1. A squelch circuit for muting constant amplitude interference during idle signal periods comprising:
    (a) a rectifier circuit connected to a signal circuit which produces an unidirectional voltage as a function of the input level including syllabic variations of speech signals,
    (b) coupling means for passing at least a substantial part of the syllabic voltage variation at the output of the (a) rectifier circuit to,
    (c) a second rectifier circuit wherein an unidirectional voltage proportional to the coupled syllabic voltage variation is produced and wherein the polarity of said unidirectional voltage is opposite to that of the voltage produced by the (a) rectifier,
    (d) means for combining the unidirectional voltages produced by the (a) and (c) rectifier circuits which is connected to,
    (e) a muting circuit so constructed as to mute waves fed therethrough to a utilization device when the (d) combined wave has the same polarity as the (a) rectifier circuit and is greater than a predetermined voltage.

2. The squelch of claim 1, wherein time delay means is connected between the signal circuit and the muting circuit.

3. The squelch circuit of claim 1, wherein a threshold circuit is used for determining whether the combined wave exceeds the predetermined voltage.

4. The squelch circuit of claim 1, wherein diode circuit means is provided at the output of the combining means for reducing the turn on time of the system when speech signals appear.

5. The squelch circuit of claim 1, wherein said squelch circuit is combined with a squelch circuit which mutes noise in order to mute both constant amplitude interference and noise.

* * * * *